(12) United States Patent
Tsironis

(10) Patent No.: US 9,625,556 B1
(45) Date of Patent: Apr. 18, 2017

(54) METHOD FOR CALIBRATION AND TUNING WITH IMPEDANCE TUNERS

(76) Inventor: Christos Tsironis, Kirkland (CA)

(*) Notice: Subject to any disclaimer, the term of this patent is extended or adjusted under 35 U.S.C. 154(b) by 1181 days.

(21) Appl. No.: 12/929,643

(22) Filed: Feb. 7, 2011

(51) Int. Cl.
  G01R 35/00 (2006.01)
  H01C 10/00 (2006.01)
  G06F 19/00 (2011.01)
  G06F 17/40 (2006.01)

(52) U.S. Cl.
  CPC ........... *G01R 35/00* (2013.01); *H01C 10/00* (2013.01); *G06F 17/40* (2013.01); *G06F 19/00* (2013.01)

(58) Field of Classification Search
  CPC . G01D 7/00; G01D 21/00; G01D 9/00; G01R 27/00; G01R 27/02; G01R 29/00; G01R 31/00; G01R 35/00; G06F 11/00; G06F 11/30; G06F 11/32; G06F 17/00; G06F 17/40; G06F 19/00; G06F 15/00; G06F 15/16; G06F 17/10; H01C 10/00
  USPC ..... 73/1.01, 432.1, 865.8, 865.9; 250/252.1; 324/600, 601, 629, 637, 638, 642; 702/1, 702/57, 64, 65, 85, 104, 106, 107, 127, 702/182, 187, 189; 708/100, 105, 200, 708/290
  IPC ............ G01D 7/00,21/00; G01R 27/00, 27/02, 29/00, 31/00, 35/00; G06F 11/00, 11/30, 11/32, 17/00, 17/40, 19/00; H01C 10/00
  See application file for complete search history.

(56) References Cited

U.S. PATENT DOCUMENTS

| | | | | |
|---|---|---|---|---|
| 2,746,015 A * | 5/1956 | Alsberg | .......................... | 324/630 |
| 2,878,999 A * | 3/1959 | Lindsey et al. | ............... | 708/842 |
| 3,412,240 A * | 11/1968 | Dell et al. | ...................... | 708/290 |
| 3,518,513 A * | 6/1970 | Luciano et al. | ............... | 318/571 |
| 3,521,270 A * | 7/1970 | Heitmann et al. | ............ | 708/290 |
| 3,532,864 A * | 10/1970 | Dertouzos | ...................... | 708/290 |
| 6,614,237 B2 * | 9/2003 | Ademian et al. | ............. | 324/601 |
| 6,653,848 B2 * | 11/2003 | Adamian et al. | ............. | 324/638 |
| 6,674,293 B1 * | 1/2004 | Tsironis | ........................ | 324/638 |
| 6,826,506 B2 * | 11/2004 | Adamian et al. | ............. | 702/118 |
| 6,920,407 B2 * | 7/2005 | Adamian et al. | ............. | 702/104 |
| 6,998,836 B2 * | 2/2006 | Tsironis | .......................... | 324/95 |
| 7,034,629 B2 * | 4/2006 | Tsironis | ....................... | 333/17.3 |
| 7,053,628 B1 * | 5/2006 | Tsironis | ........................ | 324/637 |

(Continued)

OTHER PUBLICATIONS

U.S. Appl. No. 11/498,241, filed Aug. 3, 2006, C. Tsironis.

(Continued)

*Primary Examiner* — Edward Cosimano

(57) ABSTRACT

An impedance synthesis method for single and multi-probe high resolution slide screw impedance RF and microwave tuners employs a fast calibration algorithm, which creates appropriately distributed calibration points over the Smith chart and a second order interpolation algorithm between calibration points, optimized for best suitability to the natural behavior of the tuners. The fast tuning algorithm uses a general search in order to identify the closest calibrated points, followed by a gradient search using fine interpolation grid in order to reach the final target. The method is applicable, after proper data preparation, also to double and triple probe harmonic tuners. The method allows tuning accuracy as high as −60 dB, or deviation-from-target vector distance of 0.001 units on the Smith chart, whereas absence of the fine grid interpolation typically yields accuracies of the order of −20 dB, or a deviation-from-target vector distance of 0.1 reflection factor units.

13 Claims, 16 Drawing Sheets

Tuner calibration algorithm

(56) References Cited

U.S. PATENT DOCUMENTS

| | | | |
|---|---|---|---|
| 7,135,941 B1* | 11/2006 | Tsironis | 333/17.3 |
| 7,449,893 B1* | 11/2008 | Tsironis | 324/633 |
| 7,646,267 B1* | 1/2010 | Tsironis | 333/263 |
| 7,705,787 B2* | 4/2010 | Ponce De Leon | H01Q 1/52 343/700 MS |
| 8,203,348 B1* | 6/2012 | Tsironis | 324/638 |
| 8,212,628 B1* | 7/2012 | Tsironis | 333/17.3 |
| 8,212,629 B1* | 7/2012 | Tsironis | 333/17.3 |
| 8,319,504 B2* | 11/2012 | Roff et al. | 324/638 |
| 8,405,405 B2* | 3/2013 | Tsironis et al. | 324/638 |
| 8,405,466 B2* | 3/2013 | Tsironis | 333/17.3 |
| 8,405,475 B2* | 3/2013 | Tsironis | 333/263 |
| 8,410,862 B1* | 4/2013 | Tsironis | 333/17.3 |
| 9,041,498 B1* | 5/2015 | Tsironis | G01R 27/32 333/17.3 |
| RE45,667 E* | 9/2015 | Tsironis | |
| 9,257,963 B1* | 2/2016 | Tsironis | H03H 17/0045 |
| 9,276,551 B1* | 3/2016 | Tsironis | H03H 7/40 |
| 2002/0053898 A1* | 5/2002 | Ademian et al. | 324/76.19 |
| 2002/0053899 A1* | 5/2002 | Adamian et al. | 324/76.19 |
| 2003/0122633 A1* | 7/2003 | Tsironis | 333/17.3 |
| 2003/0132759 A1* | 7/2003 | Tsironis | 324/601 |
| 2003/0173978 A1* | 9/2003 | Adamian et al. | 324/638 |
| 2004/0193382 A1* | 9/2004 | Adamian et al. | 702/118 |
| 2008/0238780 A1* | 10/2008 | Ponce De Leon | H01Q 1/52 343/700 MS |
| 2010/0301875 A1* | 12/2010 | Roff et al. | 324/629 |
| 2011/0204906 A1* | 8/2011 | Tsironis et al. | 324/750.01 |
| 2013/0002367 A1* | 1/2013 | Tsironis | 333/17.3 |
| 2013/0002379 A1* | 1/2013 | Tsironis | 334/8 |

OTHER PUBLICATIONS

"Three probe tuners tackles mutiple taks", Micorwaves & RF Magazine, Feb. 2005.
"A Load Pull System with Harmonic Tuning", ATN Microwave Inc. Microwave Journal Magazine, Mar. 1996.
Tsironis, Christos, "Load pull tuner using self-aligning single and double probes", U.S. Appl. No. 11/498,241, filed Aug. 2006.
Tsironis, Christos, "Three probe tackles multiple tasks", Microwaves & RF Magazine, Feb. 2005, pp. 90-100.
ATN Micrwave Inc, "A load pull system with harmonic tuning", Microwave Journal Magazine, Mar. 1996, pp. 122-130.
Gonzalez, Guillermo, "Microwave Transistor Amplifiers: Analysis and Design", 2nd edition, 1997 by Prentice-Hall, pp. 22-26.

* cited by examiner

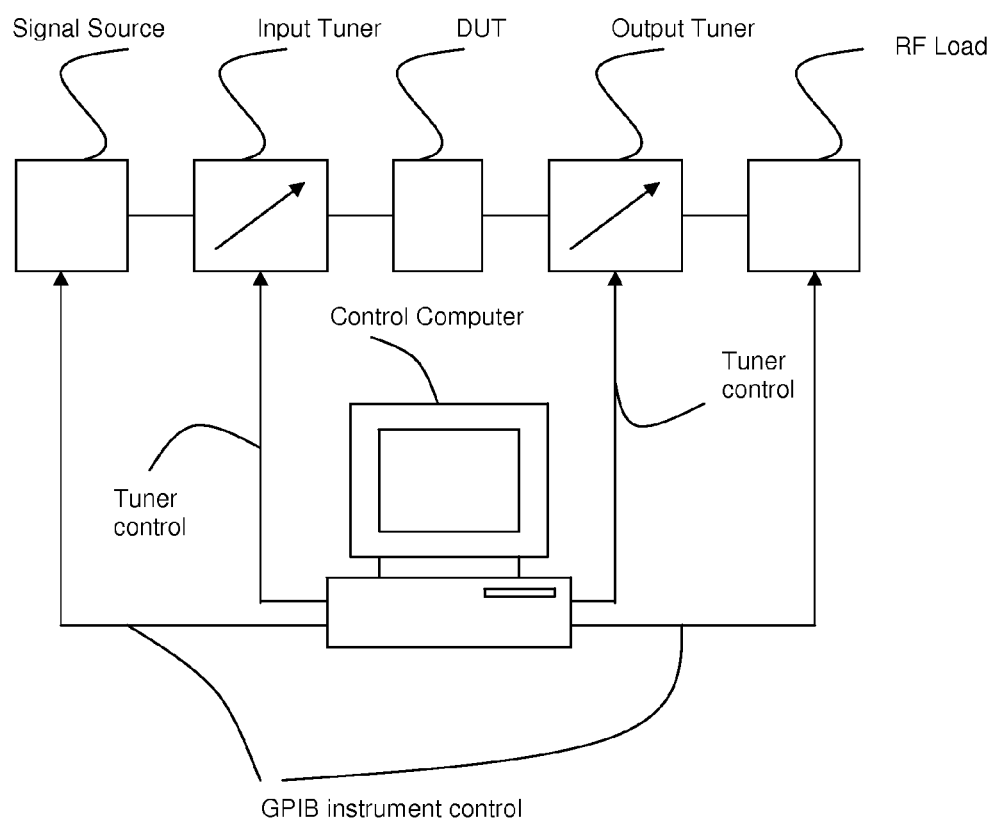
FIGURE 1: Prior art, typical automated load pull test setup

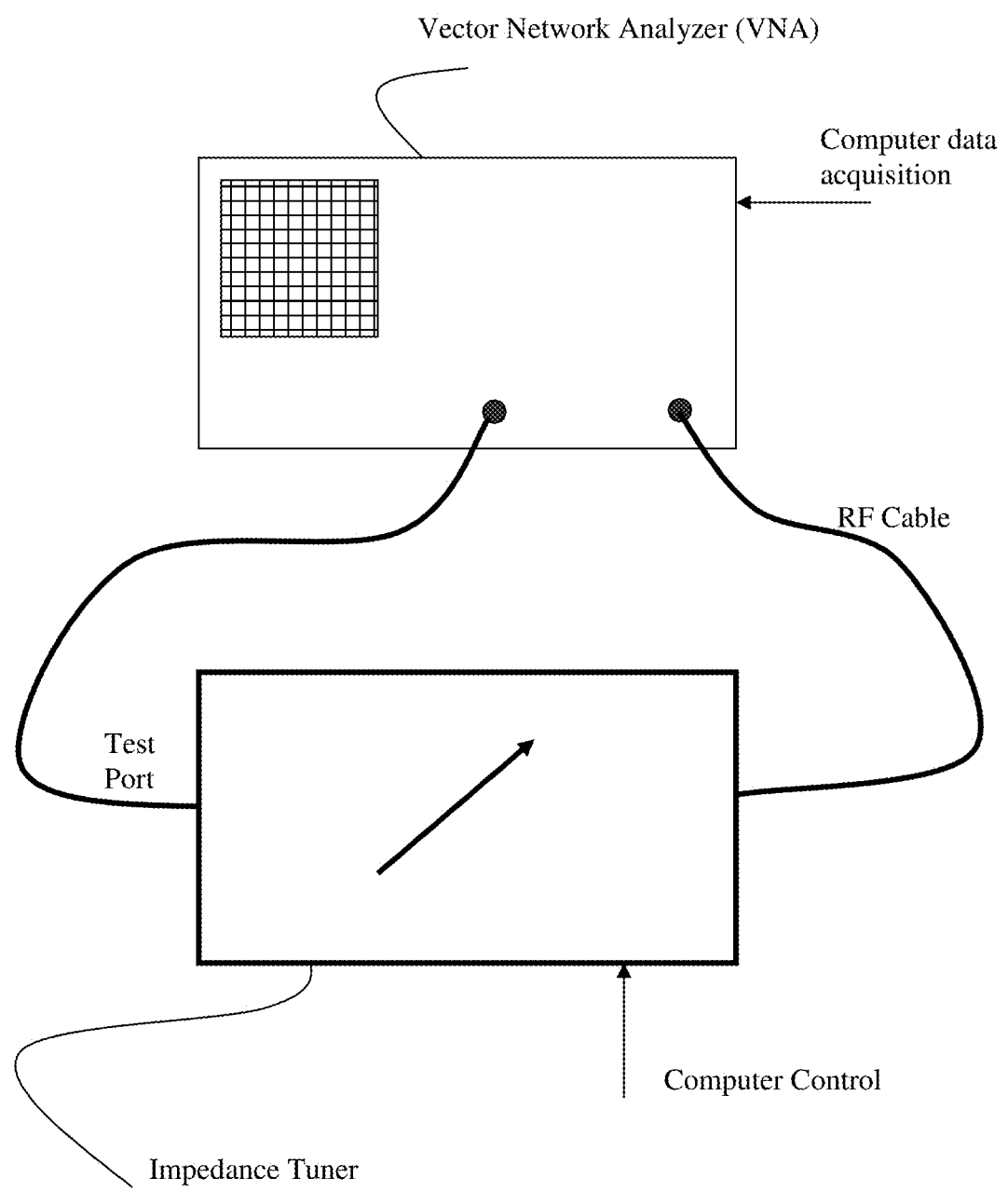
FIGURE 2: Prior art; tuner connection to VNA for calibration

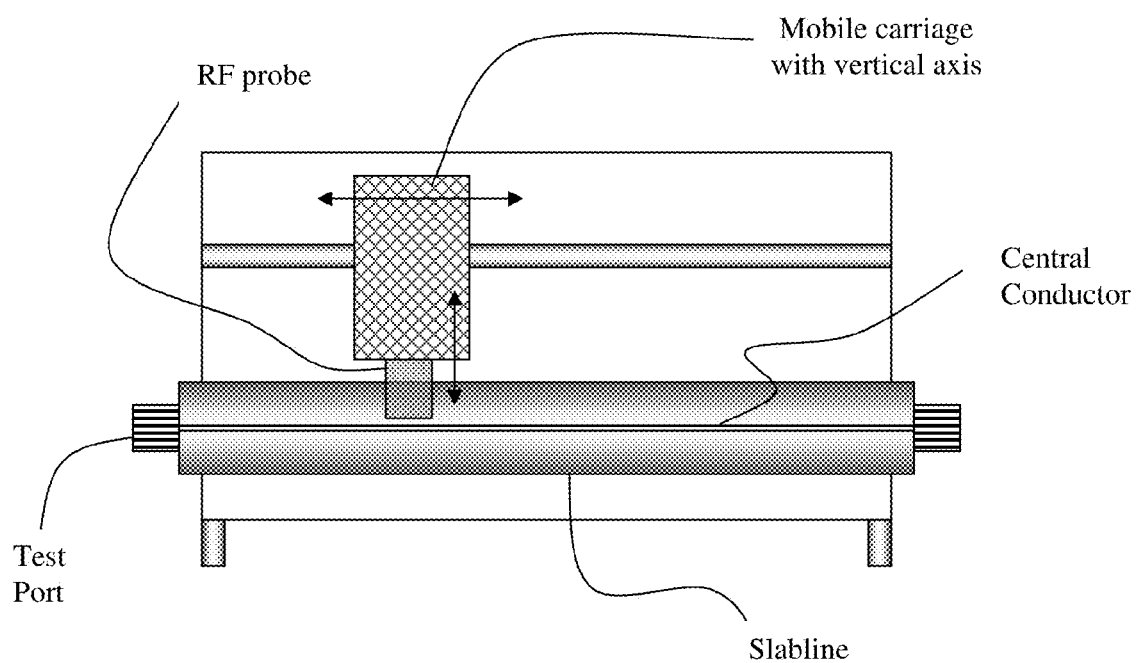
FIGURE 3: Prior art, Single probe slide screw impedance tuner

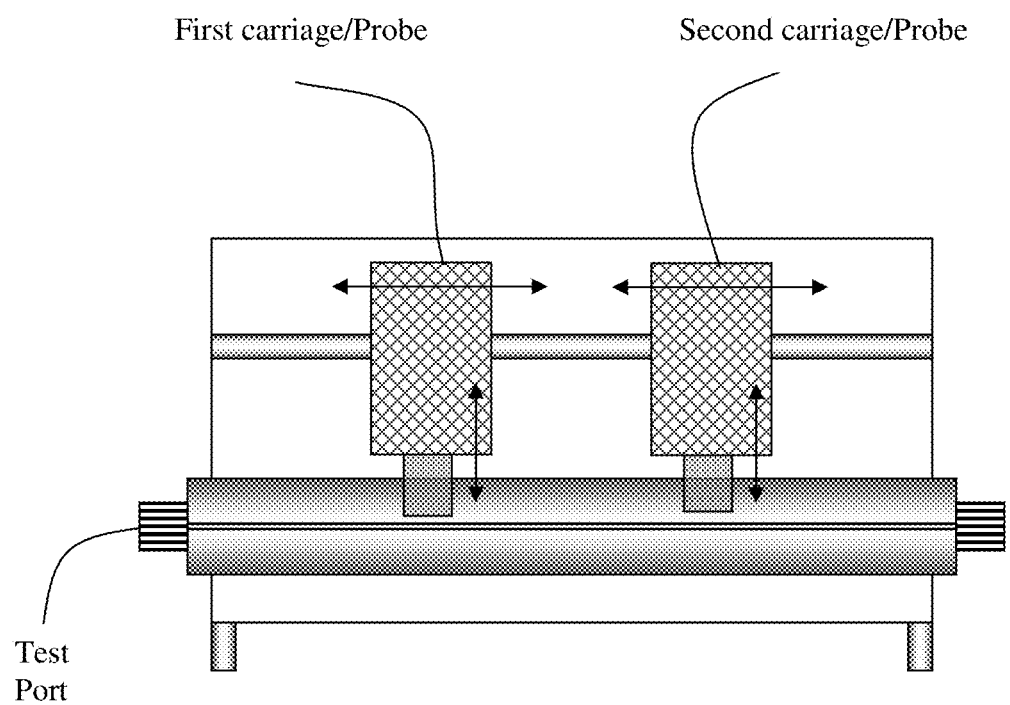
FIGURE 4: Prior art, double probe slide screw impedance tuner

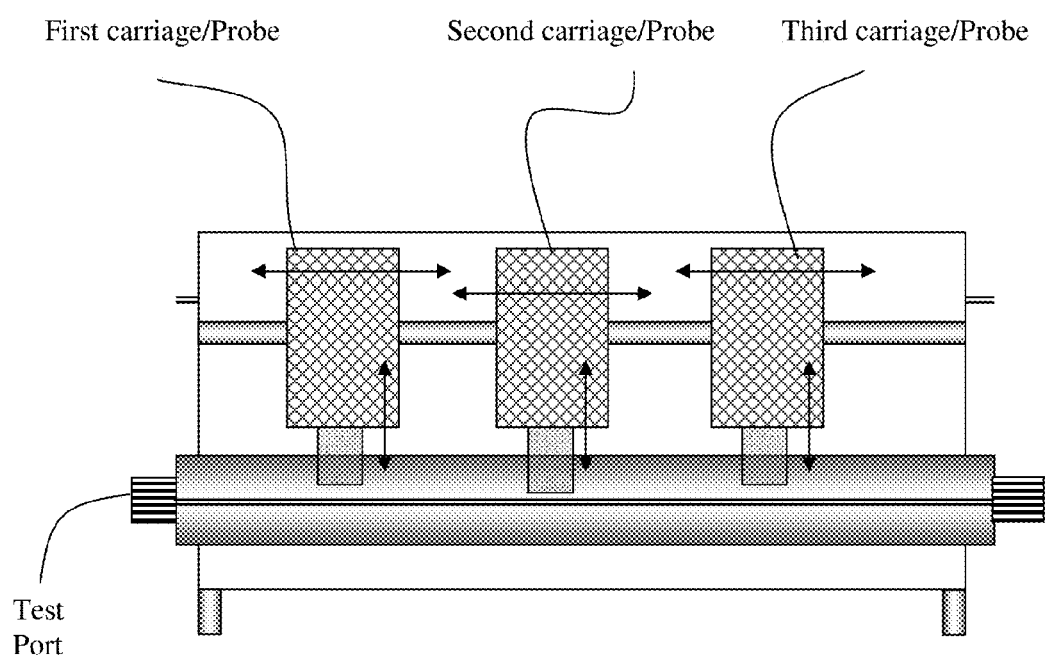
FIGURE 5: Prior art, triple probe slide screw impedance tuner

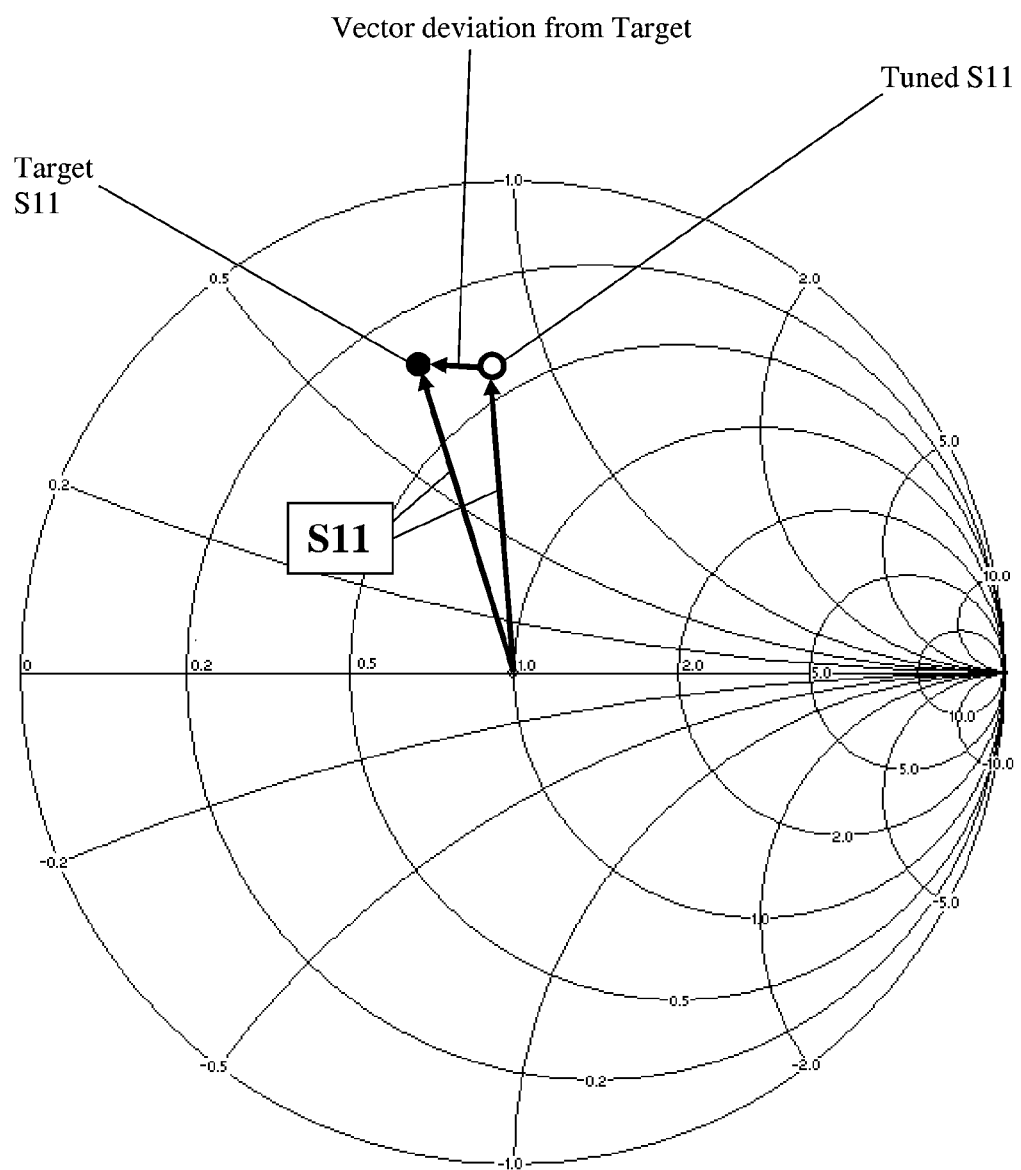
FIGURE 6: Definition of tuning error

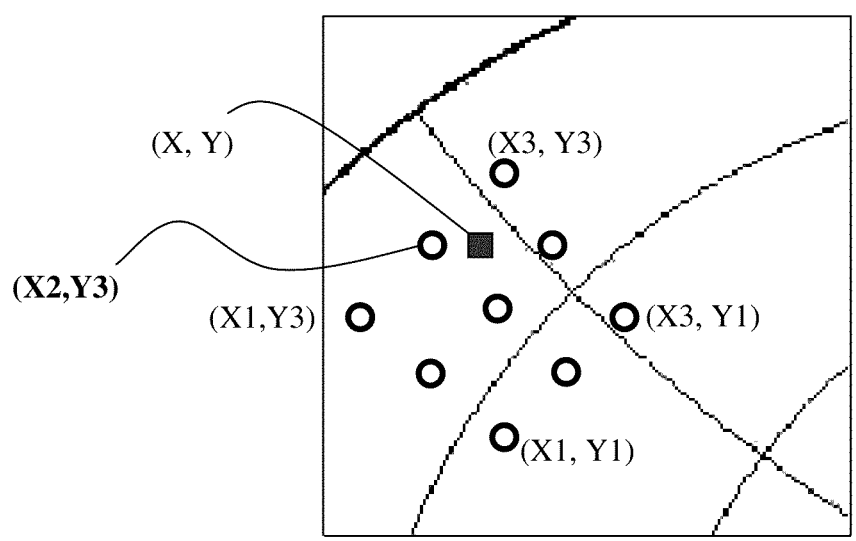
FIGURE 7: Definition of calibration points (X1, Y1) to (X3, Y3)

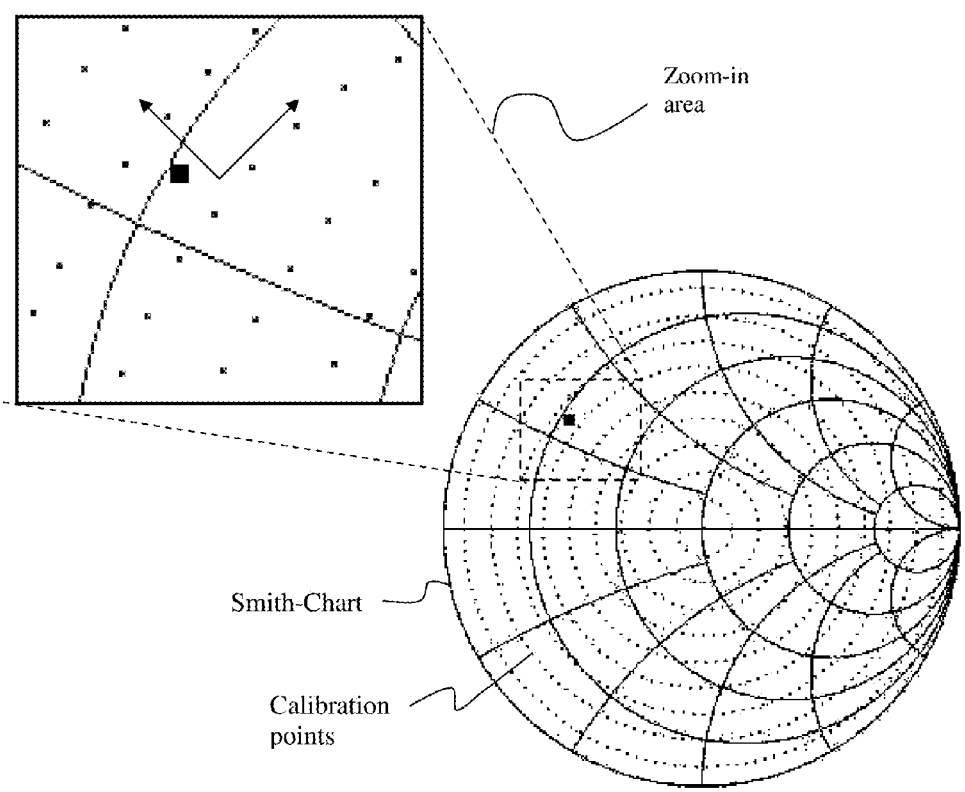
FIGURE 8: Calibration points and interpolation section for slide screw impedance tuner

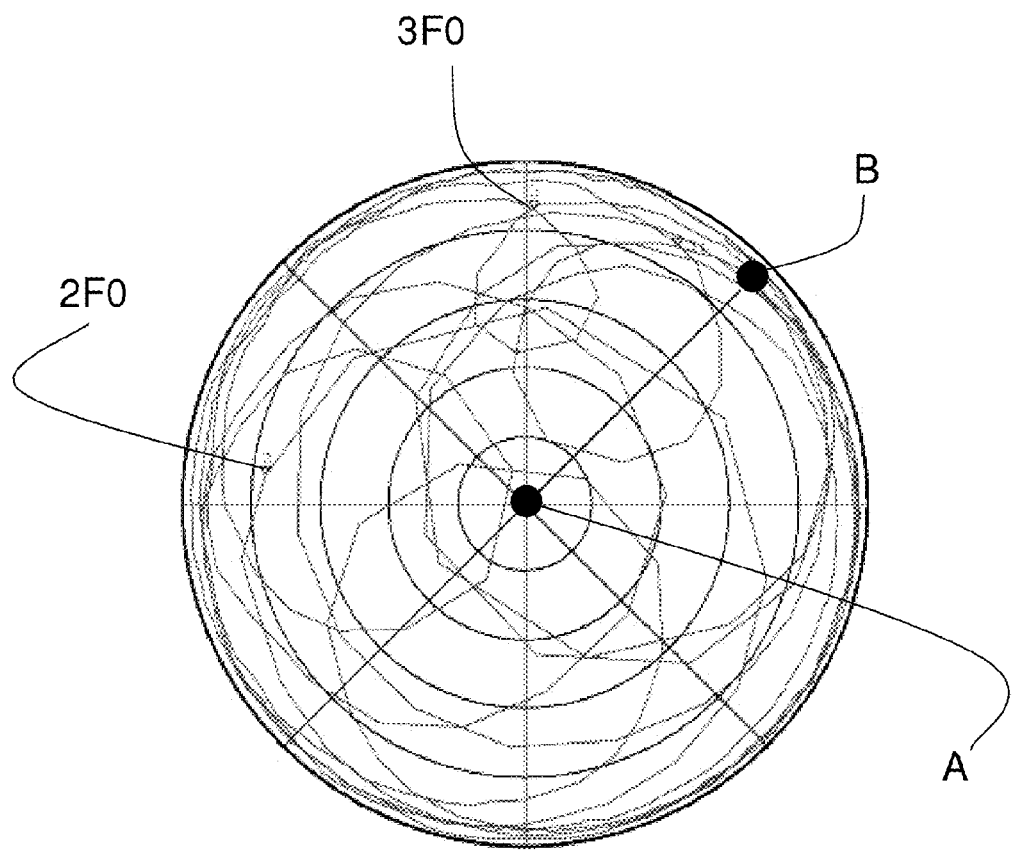
FIGURE 9: Frequency response of the reflection of a triple probe tuner

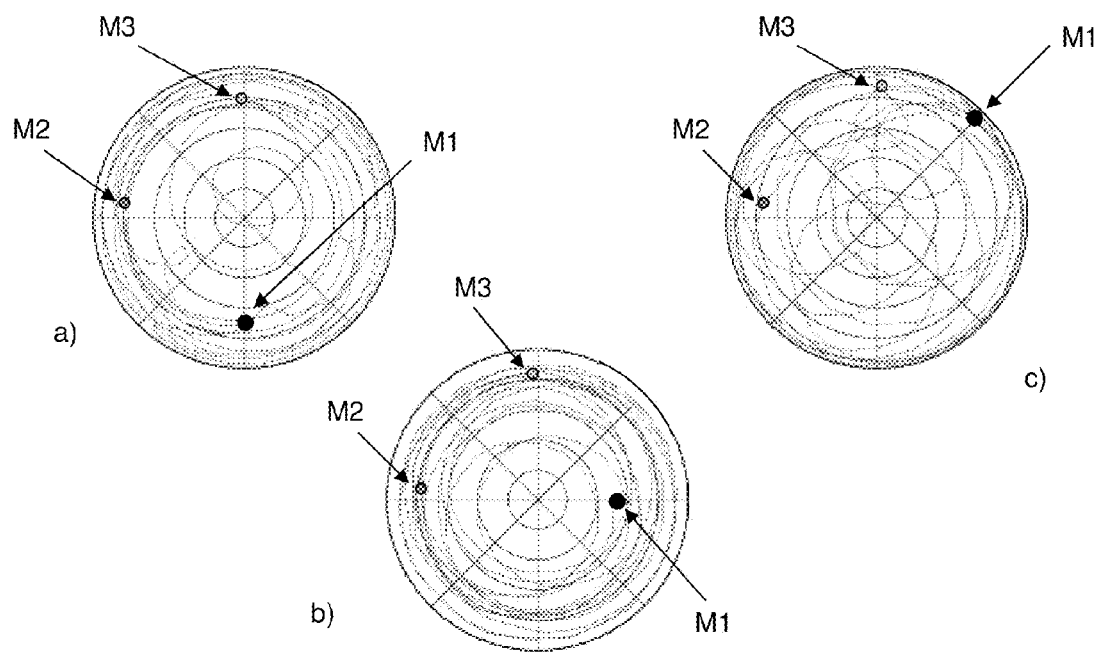
FIGURE 10: Harmonic tuning procedure using triple probe tuners

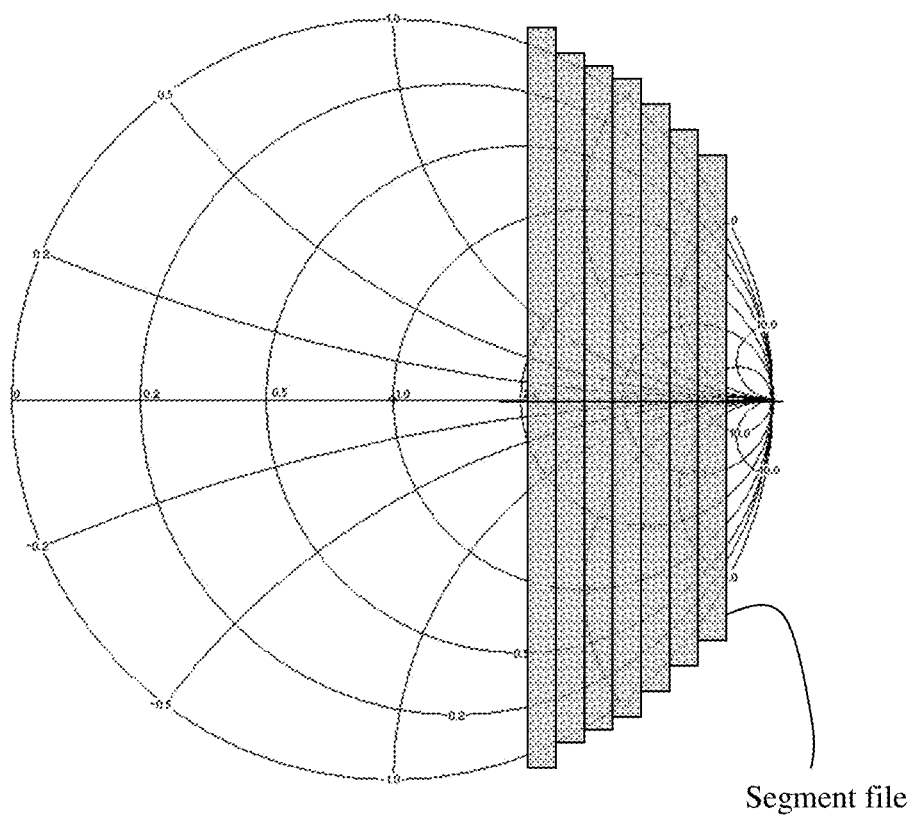
FIGURE 11: Division of Smith chart in a number of sections

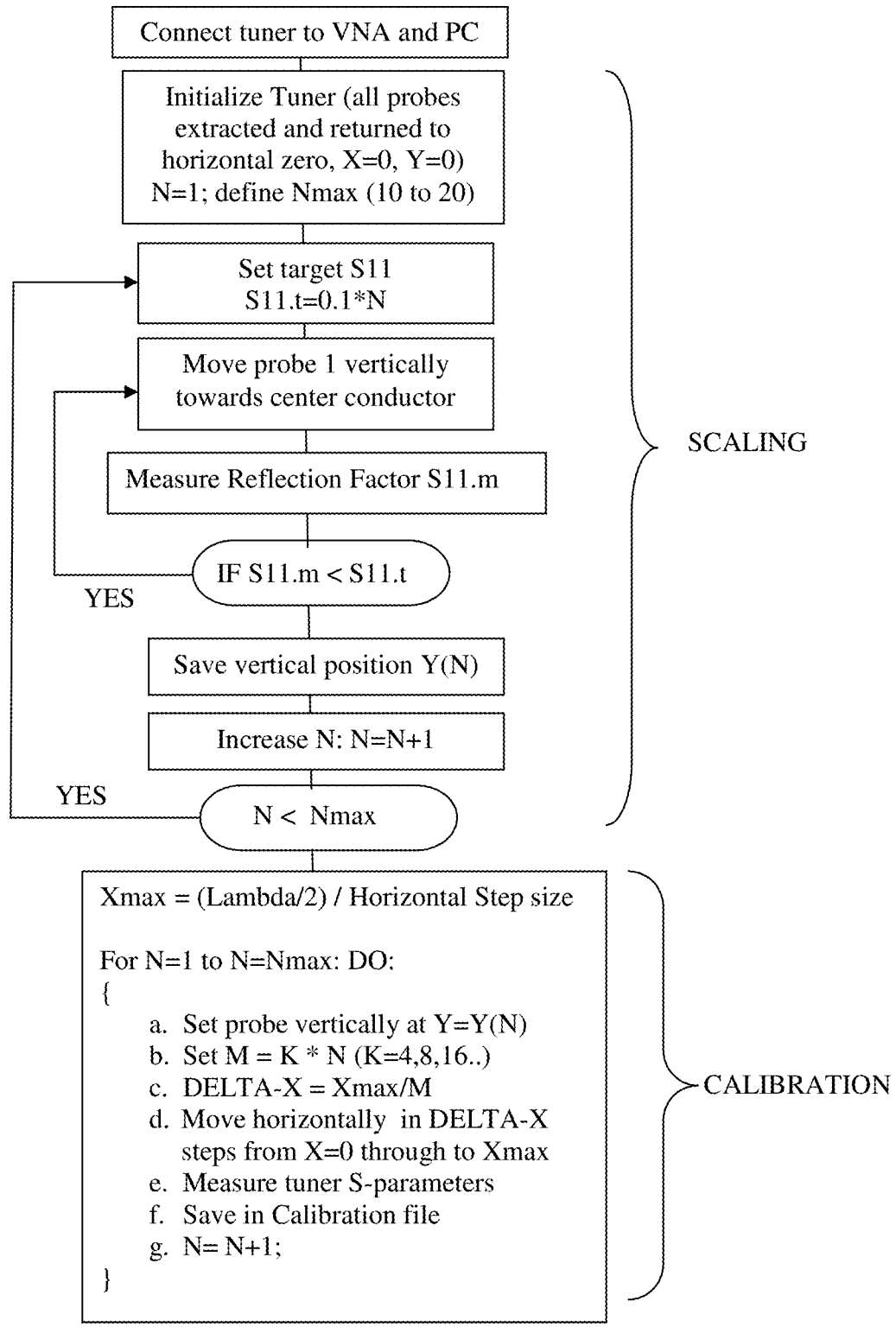
FIGURE 12: Tuner calibration algorithm

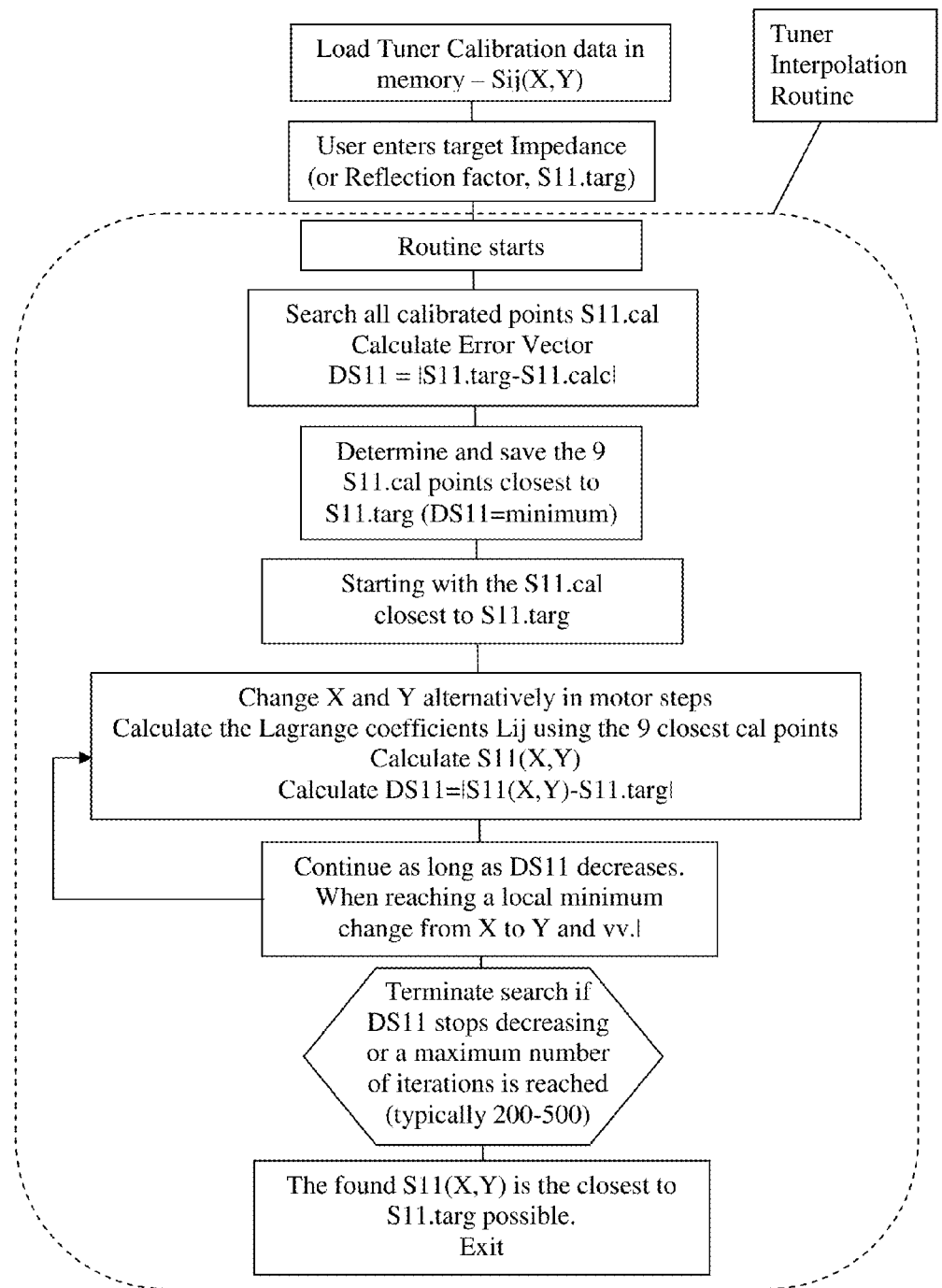
Figure 13: Tuner Interpolation algorithm and operation

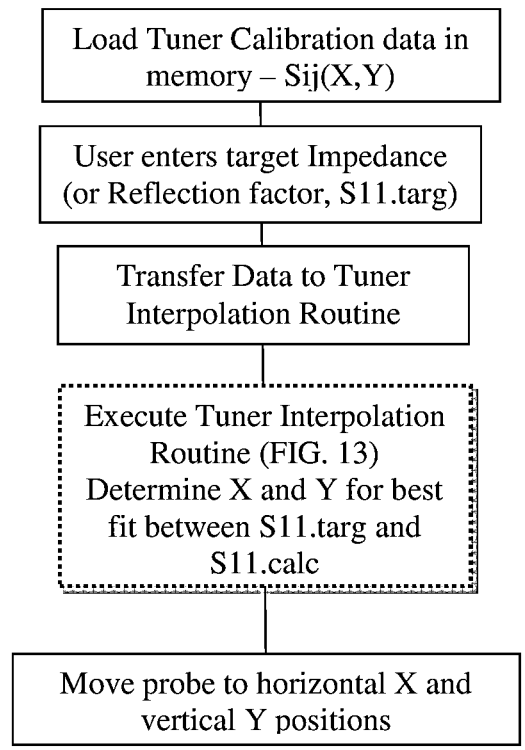
Figure 14: Tuning algorithm

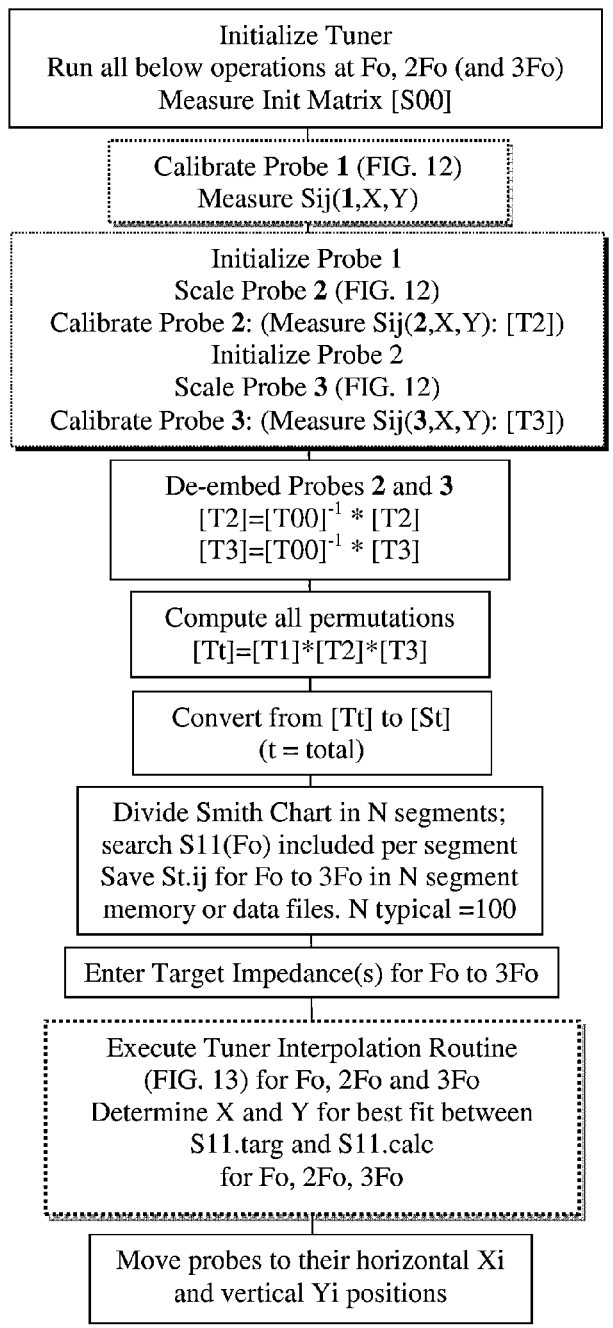
Figure 15: Harmonic tuning algorithm; [T] is transfer matrix, of [S] matrix (see ref. 6)

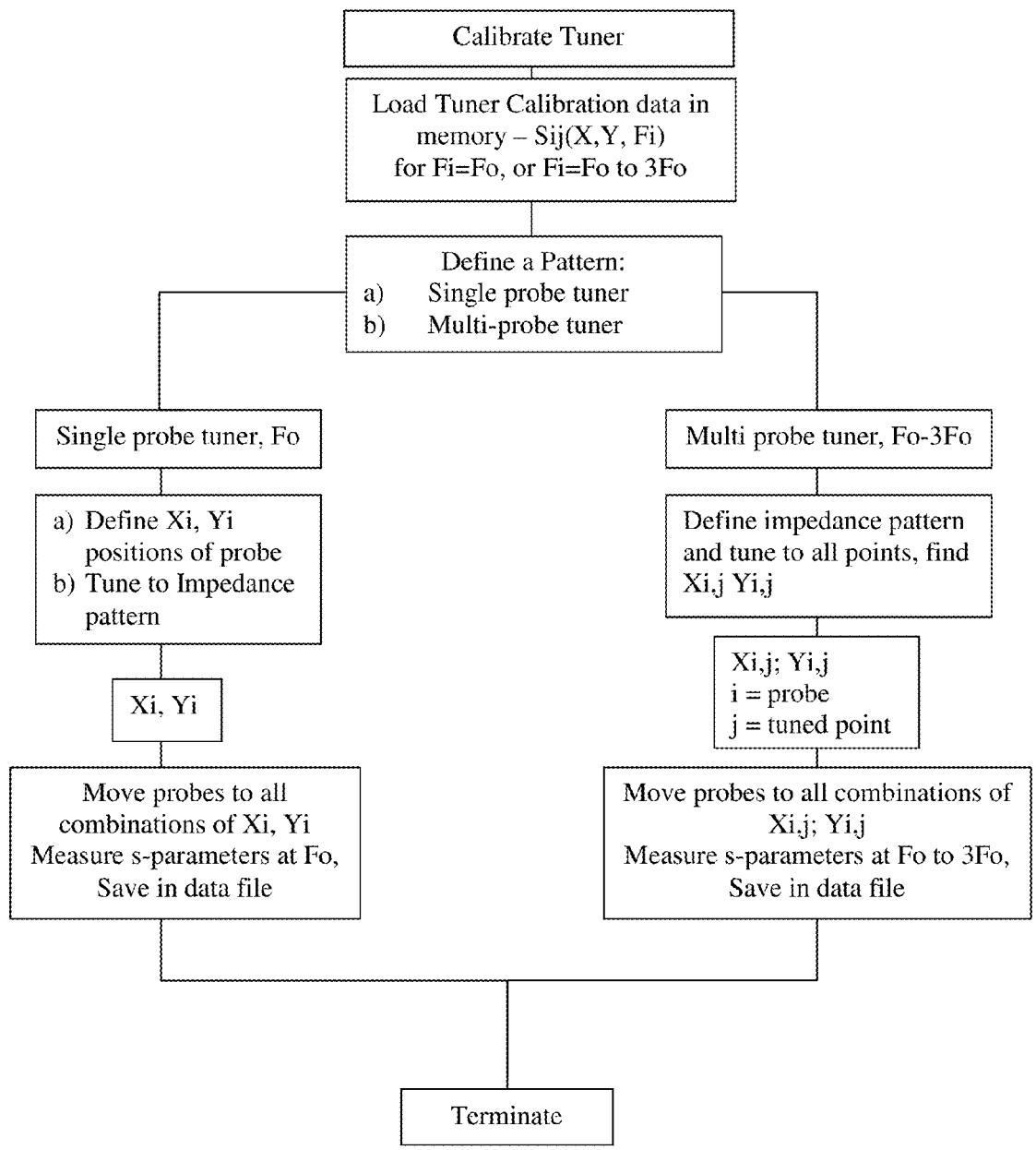
FIGURE 16: Pattern calibration algorithm

METHOD FOR CALIBRATION AND TUNING WITH IMPEDANCE TUNERS

PRIORITY CLAIM

Not Applicable

CROSS-REFERENCE TO RELATED ARTICLES

1. U.S. patent application Ser. No. 11,498,241, Load pull tuner using self-aligning single and double probes.
2. U.S. Pat. No. 6,674,293: Adaptable pre-matched tuner system and method.
3. U.S. Pat. No. 7,135,941: Triple probe automatic slide screw tuner and method.
4. "Three probe tuners tackles multiple tasks", Microwaves & RF Magazine, February 2005, page 90ff.
5. ATN Microwave Inc., "A Load Pull System with Harmonic Tuning", Microwave Journal, March 1996.
6. Gonzalez, Guillermo, Microwave Transistor Amplifiers: Analysis and Design, 2nd edition. Prentice-Hall, 1997, p. 25.

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to load pull testing of microwave power transistors using automatic microwave tuners for synthesizing reflection factors (or impedances) and match the transistors (device under test, or DUT) at the input and output of the DUT's at the fundamental and harmonic frequencies.

Modern design of high power microwave amplifiers, oscillators and other active components used in various communication systems requires accurate knowledge of the active device's (microwave transistor's) characteristics. In such circuits, it is insufficient for the transistors operating at high power close to saturation, to be described using analytical or numerical models. Instead the devices need to be characterized using specialized test setups using tuners and other test equipment under the actual operating conditions.

An efficient method for testing and characterizing transistors for high power operation is "load pull" and "source pull". Load pull or source pull are measurement techniques employing microwave impedance tuners and other microwave test equipment (FIG. 1), such as signal sources, input and output impedance tuners, RF (Radio Frequency) load, control computer and digital connections between the computer and the tuners and the test equipment. The microwave tuners in particular are used in order to manipulate the RF impedance conditions at the fundamental (Fo) and harmonic (2Fo, 3Fo and possibly higher) frequencies under which the Device under Test (DUT) is tested.

Electromechanical tuners used in load pull measurements are so called "slide screw tuners" using a low loss transmission line, typically a slotted airline (slabline) and one or more metallic probes (see references 1, 2 and 3) that can be precisely inserted into the slot of the slabline in order to create a controlled reflection factor, or RF impedance (FIGS. 3, 4). Electro-mechanical slide screw tuners are used for high power load pull testing, because they have several advantages, such as long-term stability, higher handling of RF power, easier operation and lower cost, compared to other types of tuners.

It has been found that multi-probe tuners (see references 2 and 3) can synthesize simultaneously and independently RF impedances at more than one harmonic frequency (see reference 4). In order to do so such tuners must be calibrated before-hand on a vector network analyzer and a search and tune algorithm is needed to be able to select probe settings to allow for this to happen. It is the aim of this invention to describe such an algorithm.

DESCRIPTION OF PRIOR ART

Slide screw impedance tuners are calibrated using vector network analyzers. Calibration occurs at a limited number of impedance points, which is best distributed over the Smith chart. However, in real measurement operation the calibrated points will not allow to tune to every desired impedance, even if the number of calibrated points is higher than 1,000. In this case only an accurate interpolation algorithm allows taking advantage of the high mechanical resolution of the slide screw tuners, which use stepper motors and control gear and allow several million discrete states. Based on interpolation a "tuning" algorithm would then yield the full impedance synthesis potential of a slide screw tuner.

It has been reported (see reference 5) that impedance tuners, which can generate more than 1,000,000 impedance states can be used for harmonic tuning. "Harmonic tuning" means that the impedances generated by said tuner at a fundamental (Fo) and one or more harmonic frequencies (such as 2Fo, 3Fo, etc.), can be created independently from each other; this means for instance that, when the impedance at 2Fo is changed, the impedances at Fo and 3Fo do not change; if they do change, then harmonic testing is meaningless, because it will not show the dependence of the DUT's behavior of one impedance, but of all harmonic impedances at the same time. Such tuner behavior is not classified as "harmonic tuning". Hence the notion of "harmonic tuning isolation", i.e. the change of secondary harmonic impedances with the main impedance, which has to be high, such as 40 dB (corresponding to 1% or less) at least. It has been found experimentally that 1,000,000 impedance states are not sufficient for such performance at all areas of the Smith chart.

The notion of "target tuning" is also important. Target tuning means how close to any given target impedance the tuner can be set. The tuner's mechanical construction allows, approximately 5000 horizontal×3000 vertical distinct positions of the probe in the slabline, i.e. at any frequency at least 15,000,000 tunable settings (impedances). In order to exploit this fine tuning capability, however, appropriate interpolation and tuning algorithms are needed. If such algorithms are not available then measurements are taken at the calibrated points only, which are spaced apart, and ISO contours of the measured quantity are generated graphically; this may lead to measurement inaccuracies, since the exact optimum impedance conditions are rarely met with calibrated points only.

In the case of double and triple probe tuners, where tuning at the fundamental and harmonic frequencies is possible, it has been found that much more than 10,000,000 combined impedance states for each harmonic frequency are required in order to achieve high target tuning accuracy. The typical number of mechanically available states for a three probe tuner is of the order of $(1,000,000)^3 = 10^{18}$ to $(15,000,000)^3 = 3.4 \cdot 10^{21}$ total (see reference 3). This means that we need numerical algorithms that are able to generate and handle between 1,000,000 and 15,000,000 distinct and accurately known states for each of the tuner's sections (probes), in order to direct the tuner mechanics to them. This all has been shown by practical tests and numerical models.

The only way to handle this amount of data is not through direct measurement. Assuming each data point, including tuner movement and instrument reading requires (optimistically) 1 second, calibrating 1,000,000 states would require 1,000,000 seconds (or 280 hours=11.5 days) per tuner stage, a hopeless endeavor. It is therefore necessary to think of a different approach in calibrating the tuners, collecting data and generating, numerically, accurate information for handling this huge amount of data. The purpose of this invention is to describe such a method.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a typical harmonic load pull system.

FIG. 2 depicts prior art; tuner connection to VNA for calibration.

FIG. 3 depicts prior art, single probe slide screw impedance tuner.

FIG. 4 depicts prior art, double probe slide screw impedance tuner.

FIG. 5 depicts prior art, triple probe slide screw impedance tuner.

FIG. 6 depicts the definition of tuning error on the Smith chart: it is the vector difference between the target reflection factor (S11.target) and the synthesized (tuned) reflection factor (S11).

FIG. 7 depicts the definition of calibration points (X1, Y1) to (X3, Y3) used for interpolation purposes at position (X, Y); closest point used for starting the search in this example is (X2,Y3).

FIG. 8 depicts the reflection factor pattern of calibration points and interpolation method for slide screw impedance tuner on the Smith chart.

FIG. 9 depicts the wideband frequency response of the reflection of a triple probe tuner; Points A and B are the original and the target reflection factor, while the reflection factors at 2fo and 3fo must remain constant.

FIG. 10 depicts the measured harmonic tuning procedure using triple probe tuners; the marker M1, corresponding to the reflection factor at Fo, is tuned to three different user defined positions, shown in plots a), b) and c), while the markers M2 and M3, corresponding to 2Fo and 3Fo, remain constant i.e. the impedances at the harmonic frequencies do not change whereas the impedance at the fundamental frequency changes.

FIG. 11 depicts the division of Smith chart in a number of sections in order to simplify the search for optimum starting point for harmonic tuning. The dotted rectangles indicate the size and borders of the segments and the dots symbolize the tuner states (at Fo), calibrated and interpolated, included in each segment. In reality the whole Smith chart is subdivided in such segments.

FIG. 12 depicts a flowchart of the tuner calibration algorithm, comprising two main sections, the scaling section and the calibration section itself.

FIG. 13 depicts a flowchart of the impedance point interpolation algorithm; the flowchart uses information depicted in the plots in FIGS. 7 and 8.

FIG. 14 depicts a flowchart of the impedance synthesis (tuning) algorithm itself, which uses calibration data generated in the calibration algorithm (FIG. 12) and data generated in the interpolation algorithm (FIG. 13).

FIG. 15 depicts a flowchart of the complex harmonic tuning algorithm, which uses all previous algorithms plus a data preparation (segmentation) step and an intelligent searching routine, all applied at the fundamental and harmonic frequencies simultaneously.

FIG. 16 depicts a flowchart of the algorithm allowing an impedance pattern calibration; in the case of a single probe tuner, this can be by either manually defining Xi, Yi positions or tuning to impedances; or, in the case of a tuner having two or three independent probes, by using calibration data and tuning to a user defined pattern, retrieve the Xij, Yij positions of the probes and then calibrate the tuner at those positions (hereby "i" is the index of the tuner state (impedance) and 'j' the index of the probe (1, 2 or 3).

DETAILED DESCRIPTION OF THE INVENTION

Accurate tuning using slide screw tuners needs to use appropriate calibration routines, associated with accurate interpolation algorithms and concluded by fast and efficient tuning procedures. Flowcharts for those routines and algorithms are depicted in FIGS. 12 to 16. The natural behavior of slide screw tuners is very important in developing such algorithms; since said tuners use a slabline as a basic structure and a capacitive probe, which is inserted into said slabline to create a controllable reflection (FIG. 3), the best way to describe their behavior is using polar coordinates and reflection factors, instead of impedances. Such reflection factors are best represented by the Smith chart and described with the symbol S11 (from s-parameter reflection at port 1 of the tuner), which is a vector with a real part Re(S11) and an imaginary part Im(S11), so that S11=Re(S11)+j*Im(S11).

The relation between S11 and impedance Z is S11=(Z−Zo)/(Z+Zo), where Zo is the characteristic impedance of said slabline, in typical cases Zo=50Ω and Z=Re(Z)+j*Im(Z). In the following we will use the term reflection factor or impedance equally, since the relationship is equivocal.

The first step is therefore to calibrate the tuner. This is done in all cases, independently on the number of probes and sections the tuner holds, by connecting the two tuner ports with a pre-calibrated vector network analyzer (FIG. 2). The calibration and tuning procedure is described by the flowchart of FIG. 12 and described below for three types of slide screw tuners: tuners using a single RF probe (FIG. 3), tuners using two independent probes (FIG. 4) and tuners using three independent probes (FIG. 5). The interpolation algorithm is essentially the same for all tuner types, since it is applied to a single probe each time, even if the tuner has more than one probe. A flowchart of the interpolation algorithm is depicted in FIG. 13. Tuning however varies depending on the tuner type and depending if the tuner is used to tune at a single (fundamental) frequency (Fo), or at Fo and a harmonic frequency (2Fo) or even three frequencies (Fo), (2Fo) and (3Fo). The various options and algorithms are described below. FIG. 14 depicts the flowchart of the tuning algorithm for a single probe (fundamental, Fo) tuner and FIG. 15 is a flowchart for harmonic (Fo, 2Fo and 3Fo) tuning algorithm.

A calibration algorithm for single RF probe slide screw tuners comprises the following steps (FIG. 12); in a first step the tuner is connected to a pre-calibrated vector network analyzer (VNA) and the RF probe is remotely inserted gradually into the slot of the slabline of the tuner while the reflection factor (S11) is measured at the tuner's test port on the VNA (FIG. 2); the position of the RF probe is saved for reflection factors at predetermined levels in several (typically 10 to 20) equal steps between 0, when the probe is withdrawn, and maximum reflection, close to 1 on a Smith chart, when the probe is at its maximum depth; the saved vertical positions thus correspond to S11 values of 0.1, 0.2, 0.3 . . . 0.9 etc, or 0.05, 0.1, 0.15 . . . 0.95 etc. The marked positions are saved in a data array in memory to be used immediately after; this first step procedure is called "vertical scaling".

In a second step of the calibration the saved positions are used to set the probe at various depths inside the slabline; and the probe is moved in equal distances along the slabline over a total length of half a wavelength at the test frequency, in order to create concentric reflection factor circles on the Smith chart and cover 360 degrees of reflection factor angle; the movement steps of the RF probe are chosen such as to generate a large amount of approximately equidistant reflection factors on the Smith chart; a simple method to do so is to increase the number of points (NP) on each concentric circle as the radius of the reflection factor increases following a simple rule, such as NP=N0*10*Radius, where N0 increases from 8 to 16 as the Radius increases from 0.1 to 1; this means for Radius=0.1 NP varies between 8 and 16 and for Radius=1 NP varies between 80 and 160.

For each re-positioning of the RF probe full two-port s-parameters of the tuner are measured on the network analyzer and saved in a tuner calibration file for the test frequency; this procedure yields a distribution of calibrated points (S11) on the Smith chart, at any frequency as shown in FIG. 8; upon retrieval of the s-parameters from the calibration file an interpolation algorithm is required to allow computing s-parameters of the tuner two-port at any of possible RF probe's positions not included in the grid of already measured and saved points in the calibration data file.

The calibration data by themselves do not suffice for accurate and detailed measurements. The slide screw tuner offers much higher resolution than 1,000 or 5,000 calibration points allow. The interpolation algorithm comprises two steps; given a target reflection factor (=impedance), in a first step a fast numeric search among all fixed calibration points allows to identify a grid of the 9 calibrated points closest to and surrounding the target impedance (X1,Y1) to (X3,Y3) (FIGS. 7, 8); in a second step and using the probe's horizontal (X) and vertical (Y) coordinates inside the slabline, a numerical, second order, interpolation algorithm is employed in order to calculate the s-parameters of the tuner two-port at any specific RF probe position with great accuracy; this is possible because the selected interpolation formulas describe accurately the natural behavior of the tuners, with its smooth and continuous dependence of s-parameters from horizontal and vertical positions of the RF probe.

The s-parameters of the tuner are calculated using the following interpolation formula: Sij(X,Y)=A(Y)*Sij(Xk,Y1)+B(Y)*Sij(Xk,Y2)+C*Sij(Xk,Y3), where k={1, 2, 3}. The coefficients A, B, C are calculated using the following relations: A(X)=(X−X2)*(X−X3)/((X1−X2)*(X1−X3)); B(X)=(X−X1)*(X−X3)/((X2−X1)*(X2−X3)); C(X)=(X−X2)*(X−X1)/((X3−X2)*(X3−X1)) and A(Y)=(Y−Y2)*(Y−Y3)/((Y1−Y2)*(Y1−Y3)); B(Y)=(Y−Y1)*(Y−Y3)/((Y2−Y1)*(Y2−Y3)); C(Y)=(Y−Y2)*(Y−Y1)/((Y3−Y2)*(Y3−Y1)), where X and Y are the physical horizontal and vertical positions of the RF probe inside the slabline. These formulas allow calculating the s-parameters of the tuner using 3 sets of 3 points (Xi,j-Yi,j) with {i,j}={1, 2, 3}, surrounding the requested position X,Y. The 3 sets of points are: set 1: (X1,Y1), (X1,Y2), (X1,Y3); set 2: (X2,Y1), (X2,Y2), (X2,Y3); set 3: (X3,Y1), (X3,Y2), (X3,Y3) as shown in FIG. 7. The choice is adequate because a horizontal only movement of the RF probe changes the phase and a vertical only movement mostly the amplitude of the reflection factor (FIG. 8).

The calibration and interpolation algorithms described so far are used as a base for a tuning mechanism (FIG. 14). In fact there are two types of tuning algorithms depending on the search strategy, due to the distribution of calibration points, which is caused by the natural behavior of the tuner; one applies for low and medium-high reflection factors up to approximately 0.85 and the second one applies to higher reflection factors between 0.85 and 0.99.

The first tuning mechanism comprises two steps; in a first step a fast numeric search for the closest calibrated point to the target impedance is used, as an example point (X2,Y3) in FIG. 7; once this point has been determined a second stage begins, which includes an alternative numeric search in horizontal (X) and vertical (Y) positions of the RF probe; for each new position the s-parameters are calculated using the interpolation formulas disclosed earlier and an error vector is generated between actual reflection factor and target reflection factor (FIG. 6).

Error Vector (or Vector Deviation from the Target, see FIG. 6): $EV=|S11.target-S11(X,Y)|^2$, where S11=reflection factor at the test port of the tuner, and X,Y are the actual positions of the RF probe.

The search in each probe direction continues until the error vector crosses a minimum, in which case the search is changed over to the other direction, until again a minimum is reached and so on, until a change in direction does not yield any more improvement, in which case the actual probe's position is saved as a final solution; all above fast search is executed only in computer memory and no tuner movement is necessary until a final position is found. For reflection factors up to 0.85 there is always one minimum found and it can always be found starting with the closest calibration point.

For reflection factors closer to the edge of the Smith chart (0.85<S11<0.99) an alternative impedance tuning algorithm using the same calibration data and interpolated s-parameters is used and comprises two steps; in a first step a fast numeric search for a set of the 5 to 10 calibrated points closest to the target impedance is used; in a second step an alternative numeric search in horizontal (X) and vertical (Y) directions of the RF probe is used and for each new position the s-parameters are calculated using interpolation, and an error vector is generated between actual reflection factor and target reflection factor, as described before; the search in each probe direction continues alternatively until the error vector either reaches a minimum or the search diverges; if a minimum is reached the actual said RF probe's position is saved as a preliminary solution; then the next calibration point from the set of initial solutions is chosen and the alternative horizontal-vertical position search is repeated until again, the search either diverges or yields another minimum of the error vector; the search continues until all initial calibration points have been tried and then the horizontal and vertical coordinates of the RF probe yielding the reflection factor with the smallest deviation from the target impedance is saved as a final solution; all above fast search is executed only in computer memory and no tuner movement is necessary until a final position is found.

Interpolation is, by its nature associated with error; this means that, if we rely totally on the interpolated value for the reflection factor there will be a numeric error associated to the measurement, above and beyond of the normal mechanical repeatability error of the tuner itself. In order to enhance the measurement accuracy using the tuner, an improved calibration routine is needed and described here, which uses hitherto acquired information, derived from the original "grid" calibration, interpolation and tuning routines; such routine is called a "pattern calibration algorithm" (FIG. 16).

The pattern calibration algorithm for single RF probe slide screw impedance tuners uses a user-defined set of impedance points, which are numerically tuned to using the previously described tuning algorithm; the associated horizontal and vertical coordinates of the RF probe are saved in a "pattern coordinates" file; the RF probe is then positioned at the coordinates retrieved from the pattern coordinates file and the s-parameters of the tuner are measured using the network analyzer and saved in a pattern calibration data file along with the coordinates of the probe, ready for later retrieval. Using this pattern calibration method is a little more time consuming but yields higher tuning accuracy, since it eliminates interpolation errors.

A double probe tuner (FIG. 4) cannot be calibrated by measuring all permutations of probe positions, since this would mean measuring more than 1 million points (using N=1,000 points per probe). Instead the calibration for two and three probe tuners uses a de-embedding technique, which allows measuring only 2N points, instead of $N^2$ in case of double probe and 3N instead of $N^3$ points in case of a triple probe tuner. In case of 1,000 points this means 2,000 points instead of 1,000,000 points, a gain of 500 in required time. In case of a triple probe tuner the same case means measuring 3N instead of $N^3$ points or 3,000 instead of $10^9$ points, a time saving by a factor of 333,000.

The algorithm for calibrating double or triple RF probe slide screw impedance tuners is based on the single probe calibration procedure (FIG. 12), but includes also a "de-embedding" step. In the case of a double probe tuner the calibration routine comprises the following steps: in a first step both RF probes are withdrawn from the slabline and the first probe is placed closest to the test port and the second one half a wavelength away and s-parameters of the tuner are measured at the fundamental test frequency (Fo) and the first harmonic frequency (2Fo) and saved as initialized s-parameter matrix [S00]; the said "vertical scaling" at the fundamental frequency (Fo) of the first probe is a second step, as described before. The saved vertical positions of the probe are then used to create and measure concentric reflection factor circles, also as described before. At all positions of the probe full two-port scattering parameters (s-parameters) of the tuner are measured at Fo and 2Fo, cascaded with the inverse initialized s-parameter matrix $[S00]^{-1}$ (de-embedded) and saved in a tuner calibration file for those two frequencies;

In a next step the first probe is withdrawn from the slabline and moved to its original position and the same procedure is repeated with the second probe, starting with vertical scaling; s-parameters are measured at Fo and 2Fo and saved in a second tuner calibration file, but without cascading with the inverse initialization s-parameter matrix $[S00]^{-1}$; for any horizontal and vertical position of either probe s-parameters are retrieved from the calibration files and an interpolation algorithm, as described before, is used to allow computing s-parameters of each tuner section at the probe's positions not included in the calibration data file; cascading those s-parameters of the two tuner sections yields s-parameters of the overall double probe tuner for any calibrated position combination (Xpi,Ypi) of each probe, with $\{p\}=\{1,2\}$, $\{i\}=\{1,2\}$.

The tuning algorithm for the double probe tuners uses the calibrated and interpolated s-parameter data created before and comprises five steps; in a first step s-parameters of each of N calibrated points of the first probe are cascaded with all N calibrated s-parameters of the second probe and saved in a combination data file, which contains N*N points; in a second step s-parameters included in the combination file are divided in 100 rectangular segments on the Smith chart (FIG. 11), depending on the value of the reflection factor at the test port, at the fundamental frequency Fo and associated s-parameters are saved in segment data files including the s-parameters of the tuner for the same probe positions, at the harmonic frequency 2Fo; in a third step the target impedance at the fundamental frequency is used to locate the segment data file which includes the target impedance; in a fourth step an error function is formed which contains the vector difference between target and interpolated reflection factors for the fundamental and harmonic frequencies; in a fifth step the coordinates of both probes are changed in a systematic search for a minimum value of the error function; the search is repeated with the end of a first search used as a starting point for a subsequent search until no improvement in error function is obtained, in which case said the probe coordinates are saved as final tuning solution and the tuner is moved to the corresponding positions.

To improve the tuning accuracy, by eliminating interpolation errors between calibrated points, a pattern calibration algorithm for single, double and triple RF probe tuners at a fundamental (Fo) and a harmonic (2Fo) frequency is used, which comprises two steps (FIG. 16); in a first step an impedance pattern is generated numerically for either frequency (Fo or 2Fo) keeping the impedance at the other frequency constant. This is achieved using the tuning algorithm as described before and the coordinates of both probes are saved in a data file. In a second step the tuner is connected to a vector network analyzer and the coordinates of the probes are read from the data file and positioned accordingly and s-parameters of the tuner are measured with the network analyzer at both frequencies (Fo and 2Fo) and saved in a pattern calibration file for the test frequency (Fo or 2Fo), ready for retrieval.

The calibration algorithm for triple probe tuners is an adaptation of the algorithm for double probe tuners, in that the third probe is inserted gradually in the slabline and the reflection factor measured at the fundamental frequency (Fo), the same way as for the first and second probes and all s-parameters are measured now for three frequencies (Fo, 2Fo, 3Fo). In all the de-embedding with the initial matrix $[S00]^{-1}$ is applied to two sections and s-parameters of the third section are measured and saved as such.

Finally and for any horizontal and vertical position (Xpi, Ypi) of either probe, where $\{p\}=\{1, 2, 3\}$ and $\{i\}=\{1, 2, 3\}$, the interpolation is carried through using the same algorithm as before (FIG. 13), but for each tuner $\{p\}=\{1, 2, 3\}$ section separately. The s-parameters are retrieved from the calibration file for each tuner section and the interpolation algorithm is used to calculate s-parameters of each tuner section at the probe's positions not included in the calibration data; cascading those s-parameters of all tuner sections yields s-parameters of the overall triple probe tuner for all three frequencies (Fo, 2Fo and 3Fo) and for any combination of probe positions (Xpi, Ypi) for a total of 9 combinations each time a probe moves.

Tuning with the triple probe tuner at a single frequency is as with a single probe tuner, as long as a single probe is used. But the triple probe tuner can tune up to three frequencies simultaneously, as long as the distance between frequencies is big enough. Typically this tuner is used for tuning the fundamental and two harmonic frequencies (Fo, 2Fo and 3Fo). FIGS. 9, 10 show the frequency response of triple probe tuners, when the probes are arbitrarily inserted in the slabline. The frequency response path changes with the position of each probe. The point of a tuning routine for more than a single frequency is to calculate a frequency response path, which will pass through three pre-defined points on the Smith chart. In fact harmonic tuning means synthesizing one reflection factor at one frequency at will, while keeping the reflection factor at the other two frequencies constant. This is shown in FIG. 10 by the three markers M1, M2 and M3; M1 is the user defined target impedance at Fo, M2 is the target impedance at 2Fo and M3 the target impedance at 3Fo; M2 and M3 being user defined they can be anywhere in the Smith chart, but in this case they are set to be fixed, in order to demonstrate harmonic tuning, i.e. independent impedance control at the harmonic, M1 is controlled whereas M2 and M3 do not move. The procedure for doing this is more complex than tuning a single frequency.

The tuning procedure (FIG. 15) uses calibrated s-parameters and then interpolated in four steps; the first step is a data preparation routine, which cascades s-parameters for all permutations of calibrated points of the three sections and saves them in a big data file. In case of N=500 calibration points this file includes $N^3$ points ($500^3=125*10^9$ combinations). In a second step s-parameters of the combination file are divided in approximately 100 rectangular segments on the Smith chart, depending on the location of the reflection factor at the test port, at the fundamental frequency (Fo) and associated s-parameters are saved in approximately 100 segment data files; the s-parameters saved include all three frequencies (Fo), (2Fo) and (3Fo); the number of segments has been chosen to approximately 100 experimentally and shall not limit the scope of the invention. The number of segments has been investigated and found appropriate between around 50 and 150; when chosen to 50 a slight tuning error appears, whereas increasing the number of segments beyond 100 does not provide a measurable improvement. A selection of toroid segments has also been investigated, where each segment is limited by two reflection factor values and two angles, but has not been retained, because of additional computing time required to convert coordinates from Cartesian to polar and back, but it presents, theoretically, a valid alternative.

In a third step the target impedance at the fundamental frequency is used to locate the segment data file which includes the target impedance; in a fourth step an error function is formed which contains the vector difference between target and interpolated reflection factors for the fundamental and harmonic frequencies as described before; in a fifth step the coordinates of both probes are changed in a systematic search for a minimum value of the error function; the search is repeated with the end of a first search used as a starting point for a subsequent search until no improvement in error function is obtained, in which case the probe coordinates are saved as final tuning solution and the tuner is moved to the corresponding positions.

In order to improve on interpolation errors a pattern calibration algorithm for triple RF probe tuners at a fundamental (Fo) and harmonic (2Fo, 3Fo) frequencies is used and comprises two steps; in a first step an impedance pattern is generated at either frequency (Fo, 2Fo or 3Fo) with the impedances at the remaining frequencies kept constant, using the algorithms described before and the coordinates of all three probes are saved in a data file; in a second step the tuner is connected to a vector network analyzer and the coordinates of the RF probes are read from the data file, the probes are positioned accordingly and s-parameters of the tuner are measured with the network analyzer and saved in a pattern calibration file for the selected frequency (Fo, 2Fo or 3Fo), ready for retrieval. The data file includes the probe positions and the impedances at all three frequencies.

In all above cases we used interpolation to refine the tuning resolution of all three tuner types. The reason for this is that by using calibrated points only the tuning resolution is often unacceptable. It is obvious that, if only calibrated points are used the distance to target is unacceptable for precision tuning. It is therefore imperative to use the interpolation techniques described in this patent (FIG. 13) in all cases of tuning with a slide screw tuner, and in particular when tuning at 2 or 3 frequencies using a double or a triple probe tuner.

Although the present invention has been explained hereinabove by way of a preferred embodiment thereof, it should be pointed out that other combinations of the described components are possible and, as far as obvious to a person skilled in the art, they shall not limit the scope of the present invention.

I claim:

1. An algorithm which performs calibration of single RF probe automatic slide screw impedance tuners,
   said tuners having a test port and an idle port and a slotted airline (slabline) connecting said ports; and metallic capacitive RF probes remotely insertable vertically into the slot and approaching the center conductor of said slabline, and movable horizontally along the axis of said slabline;
   said algorithm comprises two steps:
   a) the tuner is connected to a pre-calibrated vector network analyzer and the RF probe is withdrawn from the slabline and positioned closest to said test port; and said probe is then inserted gradually vertically into the slot of the slabline and reflection factor is measured at the test port; the vertical position (coordinates) of said RF probe is saved for said reflection factors at several predetermined levels between minimum and maximum reflection;
   b) the saved vertical probe coordinates are used to position said probe at various distances from the center conductor of the slabline; and
   for each vertical position the probe is moved in horizontal steps along the slabline over a distance of half a wavelength at the test frequency, hereby generating concentric reflection factor circles on the reflection factor chart (Smith chart) and covering 360 degrees of reflection factor angle;
   whereby said horizontal movement steps of the probe are within said closest position to the test port and at least one half of a wavelength at the test frequency and chosen in order to generate a large amount of reflection factor states; at every vertical and horizontal position of the probe full two-port scattering parameters (s-parameters) are measured by the network analyzer and saved in a tuner calibration file for the test frequency.

2. An algorithm performing calibration of automated slide screw impedance tuners having a test port and an idle port, a slabline between said ports and three independently controllable RF probes 1,2 and 3 as follows:

at the fundamental test frequency (Fo), the probes are initialized as follows:

probe is positioned closest to the test port of the tuner and withdrawn from the slabline, probe 2 is positioned at least one half of a wavelength at Fo away from probe 1 and withdrawn from the slabline, probe 3 is positioned at least one half a wavelength away from probe 2 and withdrawn from the slabline;

the calibration algorithm of claim 1 is applied on probe 1 at the fundamental frequency (Fo) and s-parameters of the tuner are measured at Fo and two harmonic frequencies (2Fo, 3Fo) and saved;

probe 1 is withdrawn from the slabline;

the calibration algorithm of claim 1 is applied on probe 2 at the fundamental frequency (Fo) and s-parameters of the tuner are measured at Fo and two harmonic frequencies (2Fo, 3Fo); the s-parameters of probe 2 are cascaded with the inverse initialized tuner matrix $[S00]^{-1}$ and saved;

probe 2 is withdrawn from the slabline;

the calibration algorithm of claim 1 is applied on probe 3 at the fundamental frequency (Fo) and s-parameters of the tuner are measured at Fo and two harmonic frequencies (2Fo, 3Fo); the s-parameters of probe 3 are cascaded with the inverse initialized tuner matrix $[S00]^{-1}$ and saved;

said initialized tuner matrix [S00] comprises the s-parameters of the tuner at the fundamental (Fo) and two harmonic frequencies (2Fo, 3Fo), measured when all probes are withdrawn from the slabline;

and all measured s-parameters at Fo, 2Fo and 3Fo are saved in calibration data files.

3. An algorithm performing impedance synthesis of reflection factors at the fundamental and two harmonic frequencies (Fo, 2Fo and 3Fo) using automatic slide screw impedance tuners, having a test port and an idle port and three remotely controllable independent RF probes 1, 2 and 3, employs calibrated s-parameter data of the tuner, generated using the algorithm of claim 2, whereby the reflection factor at the test port at Fo is spread on an approximately uniform grid over the Smith chart, in following steps:

a) s-parameters of all permutations of calibrated points of probes 1, 2 and 3 are cascaded and saved in a combination data file;

b) the Smith chart is divided in a number of, typically, 100 rectangular segments of similar size and associated segment files are created;

and s-parameter sets of which the reflection factor at the test port at the fundamental frequency (Fo) falls inside a segment are saved in the corresponding segment file, including the s-parameters of the tuner at the harmonic frequencies (2Fo and 3Fo);

c) the target impedance at the fundamental frequency (Fo) is used to identify the segment data file in which said target impedance is contained; all further operations are executed using only data contained in this segment file;

d) an error function is formed as the sum of the vector differences between target and calibrated reflection factors at the fundamental (Fo) and the harmonic frequencies (2Fo and 3Fo);

e) the coordinates of all probes are changed in computer memory alternatively searching for a minimum value of the error function defined in step (d) using interpolated s-parameters of the tuner at the fundamental and a harmonic frequency, calculated using s-parameters of adjacent calibration points and a second order interpolation algorithm, until no further reduction of the error function is reached; and f) hereafter the probe coordinates are saved and the probes are moved to the corresponding positions.

4. An algorithm performing calibration of automated slide screw impedance tuners having a test port and an idle port, a slabline between said ports and two independently controllable RF probes, a first probe (1) and a second probe (2) as follows:

probe is initially positioned closest to the test port of said tuner and probe 2 is withdrawn from the slabline and positioned at least one half of a wavelength (at Fo) away from probe 1, the calibration algorithm of claim 1 is applied on probe 1 at the fundamental frequency (Fo) and s-parameters of the tuner are measured at Fo and a harmonic frequency (2Fo, 3Fo . . . ) and saved;

the calibration algorithm of claim 1 is applied on probe 2 at the fundamental frequency (Fo) and s-parameters of the tuner are measured at Fo and a harmonic frequency (2Fo, 3Fo . . . ); the s-parameters of probe 2 are cascaded with the inverse initialized tuner matrix and saved; and said initialized tuner matrix comprises the s-parameters of the tuner at the fundamental (Fo) and a harmonic frequency (2Fo, 3Fo . . . ), measured when both probes are withdrawn from the slabline.

5. An algorithm performing impedance synthesis of reflection factors at two harmonic frequencies (Fo and 2Fo or 3Fo) using automatic slide screw impedance tuners, having a test port and an idle port and two remotely controllable independent RF probes and 2, employs calibrated s-parameter data of the tuner, generated using the algorithm of claim 4, whereby the reflection factor at the test port at Fo is spread on an approximately uniform grid over the Smith chart, in following steps:

a) s-parameters of all permutations of calibrated points of probes and 2 are cascaded and saved in a combination data file;

b) the Smith chart is divided in a number of, typically, 100 rectangular segments of similar size and associated segment files are created; and s-parameter sets of which the reflection factor at the test port at the fundamental frequency (Fo) falls inside a segment are saved in the corresponding segment file, including the s-parameters of the tuner at a harmonic frequency (2Fo, 3Fo . . . );

c) the target impedance at the fundamental frequency (Fo) is used to identify the segment data file in which said target impedance is contained; all further operations are executed using only data contained in this segment file;

d) an error function is formed as the sum of the vector differences between target and calibrated reflection factors at the fundamental (Fo) and a harmonic frequency (2Fo, 3Fo . . . );

e) the coordinates of both said RF probes are changed in computer memory alternatively searching for a minimum value of the error function defined in step d) using interpolated s- parameters of the tuner at the fundamental and a harmonic frequency, calculated using s-parameters of adjacent calibration points and a second order interpolation algorithm, until no further reduction of the error function is reached; and f) hereafter the probe coordinates are saved and the probes are moved to the corresponding positions.

6. A calibration algorithm for automatic slide screw impedance tuners having two independent RF probes 1 and 2 at a fundamental (Fo) and one harmonic frequency (2Fo or 3Fo) comprises two steps:
   a) a set of N reflection factors Gamma.i (i=1 to N, N>1) is selected and tuned-to for one of the two calibrated frequencies (Fo, 2Fo or 3Fo) using the tuning algorithm of claim 5, while keeping the impedance at the other frequency constant, and the horizontal X1.i,X2.i and vertical Y1.i,Y2.i coordinates of both probes are saved in a data file; and
   b) said tuner is connected to a calibrated vector network analyzer and the coordinates of probes 1 and 2 are retrieved from the data file, said probes are positioned accordingly and s-parameters of the tuner are measured and saved in a calibration file, ready for later use.

7. An algorithm performing impedance synthesis for single probe impedance tuners for target reflection factors between approximately 0 and 0.85 using tuner calibration and interpolated s-parameter data,
   whereby said calibration data are generated by measuring two-port tuner s- parameters for a plurality of horizontal and vertical probe positions,
   and whereby said interpolated data are created using second order interpolation method for any probe position included in a grid of calibrated points,
   in two steps:
   a) searching numerically and identifying the closest calibrated point to the target reflection factor;
   b) searching numerically alternatively in horizontal and vertical direction of the probe coordinates and use interpolated data for each set of coordinates to calculate an error vector as the difference between interpolated and target reflection factors;
   the search in each direction continues until the error vector crosses a local minimum, in which case the search switches over to the other direction, until again a local minimum of the error vector is reached;
   the numeric search continues, until a change in direction does not yield any reduction of the error vector, in which case the probe's coordinates are saved as a final solution; all above numeric search is executed in computer memory and no tuner movement is necessary until a final position is found; and once a final position is found, the tuner probe is moved to it to generate the target impedance.

8. An algorithm performing impedance synthesis for single probe impedance tuners for target reflection factors between approximately 0.85 and 0.99 using tuner calibration and interpolated s-parameter data,
   whereby said calibration data are generated by measuring two-port tuner s-parameters for a plurality of horizontal and vertical probe positions,
   and whereby said interpolated data are created using second order interpolation method for any probe position included in a grid of calibrated points, comprises two steps:
   a) a numeric search identifies a grid of approximately 5 calibrated points closest to the target reflection factor;
   b) starting with the calibration point closest to the target reflection factor a numeric search alternatively in horizontal and vertical direction of the probe is performed and for each new position the s-parameters are calculated using interpolated data; an error vector is calculated as the difference between interpolated and target reflection factors; the search in either direction continues alternatively until the error vector either reaches a minimum or the search diverges; if a minimum is reached the actual probe coordinates are saved as a preliminary solution;
   then the next closest calibration point to the target reflection factor is chosen and the alternative horizontal-vertical direction search resumes until the search either diverges or yields another minimum of the error vector; the search continues until all points of the grid have been tried;
   finally the horizontal and vertical coordinates of the probe yielding the smallest error vector are saved as a final solution; and once a final position is found, the tuner probe is moved to it to generate the target impedance.

9. An algorithm performing s-parameter interpolation for automated slide screw tuners having a test port and an idle port, a slabline between said ports and two independently controllable RF probes, probe and probe 2 for any set of coordinates X1,Y1 of probe 1 and X2,Y2 of probe 2, and a fundamental (Fo) and a harmonic (2Fo or 3Fo) frequency as follows:
   a) the tuner is calibrated by positioning each probe individually, the other probe being withdrawn from the slabline (initialized), at a multitude of horizontal (X) and vertical (Y) positions, in order to create reflection factors (Gamma) covering the whole Smith chart (from Gamma approximately zero to maximum close to land over 360 degrees) at the fundamental frequency Fo;
   b) s-parameters of the tuner are measured at said frequencies Fo and 2Fo or 3Fo;
   c) s-parameters of probe 2 are de-embedded (cascaded with the inverse s-parameter matrix $[S00]^{-1}$ of the tuner, said [S00] matrix being measured at said frequencies when both probes are withdrawn from the slabline);
   d) s-parameter for each probe and each said frequency are interpolated;
   e) s-parameters of probe and de-embedded s-parameters of probe 2, calculated in step (d), are cascadedand saved.

10. A calibration method for an automatic single probe slide screw tuner at a test frequency Fo, said tuner being controlled by a control processor,
   whereby said processor runs software able to interpolate s-parameters of said tuner for arbitrary probe positions,
   and whereby said processor runs software able to tune to arbitrary reflection factors inside the Smith chart, said calibration method comprises the following steps:
   a) s-parameters of said tuner are measured at a multitude of probe positions selected to generate reflection factors distributed approximately uniformly over the entire Smith chart, and saved;
   b) a number N1 of reflection factors is selected;
   c) the tuner is instructed to tune to the reflection factors of step (b) and save the associated probe positions;
   d) the tuner is directed to probe positions of step (c) and s-parameters are measured;
   e) s-parameters measured in step (d) are saved in a calibration file comprising the test frequency, the probe positions and the measured s-parameters.

11. A calibration method for an automatic slide screw tuner, having two independent probes 1and 2, at test frequencies Fo and 2Fo,
   said tuner being controlled by a control processor,
   whereby said processor runs software able to interpolate s-parameters of said tuner for arbitrary positions of each probe, and whereby said processor runs software able to tune to arbitrary reflection factors inside the Smith chart for each frequency independently, said calibration method comprises the following steps:

a) s-parameters of said tuner are measured at Fo and 2Fo at a multitude of positions of each probe selected to generate reflection factors at Fo distributed approximately uniformly over the entire Smith chart, and saved;

b) s-parameters of probe 2 are de-embedded at Fo and 2Fo using the tuner initialization matrix, measured when all probes are withdrawn;

c) s-parameters of probes 1 and 2 are cascaded for all permutations of probe positions;

d) a number N2, of reflection factors is selected at Fo and 2Fo;

e) the tuner is instructed to tune to the reflection factors of step (d) and save the associated probe positions;

f) the tuner is directed to probe positions of step (e) and s-parameters are measured;

g) s-parameters measured in step (f) are saved in a calibration file comprising the test frequencies, the probe positions and the measured s-parameters.

12. A calibration method for an automatic slide screw tuner, having three independent probes 1,2 and 3, at test frequencies Fo, 2Fo and 3Fo, said tuner being controlled by a control processor, whereby said processor runs software able to interpolate s-parameters of said tuner for arbitrary positions of each probe, and whereby said processor runs software able to tune to arbitrary reflection factors inside the Smith chart for each frequency independently, said calibration method comprises the following steps:

a) s-parameters of said tuner are measured at Fo, 2Fo and 3Fo at a multitude of positions of each probe selected to generate reflection factors at Fo distributed approximately uniformly over the entire Smith chart, and saved;

b) s-parameters of probes 2 and 3 are de-embedded at Foto 3Fo using the tuner initialization matrix, measured when all probes are withdrawn;

c) s-parameters of probes 1 to 3 are cascaded for all permutations of probe positions;

d) a number N3 of reflection factors is selected at Fo, 2Fo and 3Fo;

e) the tuner is instructed to tune to the reflection factors of step (d) and save the associated probe positions;

f) the tuner is directed to probe positions of step (e) and s-parameters are measured;

g) s-parameters measured in step (f) are saved in a calibration file comprising the test frequencies, the probe positions and the measured s-parameters.

13. An algorithm performing s-parameter interpolation for multi-probe automatic slide screw impedance tuners at a fundamental and two harmonic frequencies (Fo, 2Fo, 3Fo), said tuners having a test port and an idle port, a slabline between said ports and three wideband RF probes 1, 2 and 3 placed at horizontal and vertical positions (Xt1,Yt1) of probe 1, (Xt2,Yt2) of probe 2 and (Xt3,Yt3) of probe 3, said probes being independently controllable, insertable and movable into the slot of the slabline, said algorithm comprising the following steps:

a) generate calibration data as follows:
  i. initialize all probes by withdrawing from the slabline and moving probe 1 closest to said test port, probe 2 at least one half of a wavelength away and probe 3 at least one wavelength away from probe 1, at Fo;
  ii. measure the s-parameters of said tuner and save in matrix [S00] at Fo, 2Fo, 3Fo;
  iii. move probe to vertical and horizontal positions allowing generation of reflection factors (S11) covering the Smith chart approximately equidistantly at Fo, measure and save s-parameters at Fo, 2Fo, 3Fo;
  iv. move probe 2 to vertical and horizontal positions allowing generation of reflection factors (S11) covering the Smith chart approximately equidistantly at Fo, measure s-parameters at Fo, 2Fo, 3Fo, cascade the inverse matrix $[S00]^{-1}$ with said s-parameters and save;
  v. move probe 3 to vertical and horizontal positions allowing generation of reflection factors (S11) covering the Smith chart approximately equidistantly at Fo, measure s-parameters at Fo, 2Fo, 3Fo, cascade the inverse matrix $[S00]^{-1}$ with said s-parameters and save;
  vi. cascade all permutations of s-parameters in steps (a.iii) to (a.v) and save;

b) interpolate s-parameter for probe coordinates (Xt1,Yt1) to (Xt3,Yt3) and for each frequency Fo, 2Fo and 3Fo, using data saved for each probe in steps (a.iii), (a.iv) and (a.v) correspondingly, and save;

c) cascade s-parameters of probes 1, 2 and 3 generated in step (b) at all frequencies for the above probe coordinates (Xt1,Yt1) to (Xt3,Yt3).

* * * * *